United States Patent [19]

Kerber

[11] Patent Number: 5,728,609
[45] Date of Patent: Mar. 17, 1998

[54] METHOD FOR PRODUCING CONTACT HOLES

[75] Inventor: Martin Kerber, München, Germany

[73] Assignee: Siemens Aktiengesellschaft, Munich, Germany

[21] Appl. No.: 706,820

[22] Filed: Sep. 3, 1996

[30] Foreign Application Priority Data

Sep. 1, 1995 [DE] Germany ............ 195 32 380.7

[51] Int. Cl.$^6$ ................................. H01L 21/00
[52] U.S. Cl. .................. 438/149; 438/151; 438/197; 438/297
[58] Field of Search ................. 438/149, 151, 438/197, 294, 297, 666

[56] References Cited

U.S. PATENT DOCUMENTS 4,753,896  6/1988  Matloubian .................. 438/149
5,492,857  2/1996  Reedy et al. .................. 438/149

*Primary Examiner*—Trung Dang
*Attorney, Agent, or Firm*—Herbert L. Lerner; Laurence A. Greenberg

[57] ABSTRACT

A method for producing contact holes in MOS integrated circuits by the SOI technique, with an oxide layer and a silicon layer above it, includes producing raised contact hole regions on an initially relatively thick silicon layer with a first mask in a first method step. A LOCOS insulation which is made with a second mask in a second method step is effected solely in a region that was thinned in the first method step.

7 Claims, 2 Drawing Sheets

METHOD FOR PRODUCING CONTACT HOLES

BACKGROUND OF THE INVENTION

FIELD OF THE INVENTION

The invention relates to a method for producing contact holes in MOS integrated circuits by the SOI technique, with an oxide layer and a silicon layer above the oxide layer.

In the SOI technique, circuits are made in a thin silicon film that is disposed on an insulator. The properties of those circuits are favorable especially when the active silicon layer is thin enough to ensure that a "fully depleted", or charge-carrier-free, zone is created in the active silicon region. In so-called "surface channel circuits" and when submicrometer technology is employed, the requisite thickness for the purpose is preferably on the order of magnitude of 50 to 80 nm. Those extremely thin silicon layers make special demands on the conduct of the process, and especially on the isotropic etching of oxide layers, since such layers are not arbitrarily selective to silicon. Although recourse may be made to altered process sequences for etching spacers, etching-in is unavoidable when etching the contact holes. Moreover, after the contact hole etching, not only the polymer but also the uppermost silicon layer must be removed. That layer is severely damaged and would cause increased contact resistance.

It is known to circumvent the critical step of contact hole etching by choosing a basic SOI material that has a silicon layer somewhat thicker than would be required for MOS circuits with a fully depleted active region. In a first process block, the silicon in the active region is thinned to the desired thickness. However, since there are different thicknesses present in the basic SOI material, continuing the process with an insulation technique accomplished by local complete oxidation of the silicon layer is quite difficult, since in that technique the conduct of the process would have to be geared to the maximum silicon layer. In that case, however, regions with a markedly lesser thickness are also present, in which the oxidation continues to form laterally beneath the nitride mask that is used. As a result, there is an unacceptably great loss of mass precisely in the critical active regions. Instead of local complete oxidation, mesa etching may also be employed. Then, however, undesired parasitic sidewall transistors and gate oxide thinning at the mesa edge occurs, and even further process provisions are in turn required for the control thereof.

SUMMARY OF THE INVENTION

It is accordingly an object of the invention to provide a method for producing contact holes, which overcomes the hereinafore-mentioned disadvantages of the heretofore-known methods of this general type and in which the production of the contact holes and the entire conduct of the process is especially reliable, while at the same time providing an extremely thin active region.

With the foregoing and other objects in view there is provided, in accordance with the invention, a method for producing contact holes in MOS integrated circuits by the SOI technique, which comprises covering an oxide layer with a silicon layer having a thickness being greater than a thickness required for active regions of MOS circuits; applying a first mask to contact hole regions, and thinning regions not covered by the first mask to a thickness suitable for the active regions; covering the active regions, supply lead regions and the contact hole regions with a second mask, and insulating regions not covered by the second mask with a LOCOS insulation; and then creating connections to the active region and an insulating layer, and effecting contact hole etching through the connections.

According to the basic concept of the invention, the silicon layer, also known as a body, that rests on the oxide layer is made with a thickness that is greater than the thickness required for the active regions of MOS circuits. A first mask is applied to the contact hole regions, and the regions not covered by it are thinned to a thickness suitable for the active regions. With a second mask, the active regions, the supply lead regions and the contact hole regions are covered, and the regions not covered by it are insulated with a LOCOS insulation. In further steps, a connection is made to the active region and an insulating layer, with the actual contact hole etching being effected through the insulating layer.

Through the use of this method, extremely thin silicon regions for "fully depleted" MOS circuits and regions with locally thicker silicon for adequate process reliability in the production of contact holes are created, and at the same time a process conduct that is compatible with the LOCOS insulation is employed, with which especially exact oxidation can be performed. The contact hole regions and therefore also the original silicon layer are constructed in thickened fashion, since in the final contact hole etching, etching-in into the contact hole regions is unavoidable and the silicon layer in this region cannot be allowed to be removed completely.

In accordance with another mode of the invention, the supply lead regions and in particular the source supply lead region are covered with the first mask. As a result, the supply lead resistance from the contact region to the active region can be reduced. This provision is especially relevant for the source supply lead, but can also be advantageously employed for the drain supply lead.

In accordance with a further mode of the invention, the thinning of the regions not covered by the first mask is advantageously also carried out by a LOCOS technique, since that makes reliable conduct of the process possible.

In accordance with an added mode of the invention, in order to assure that when the second mask is used the LOCOS insulation will be formed only in regions that have already been thinned in the first thinning step, the second mask is made larger than the first, so that a kind of derivative lead is also created around the contact hole regions.

In accordance with a concomitant mode of the invention, CMOS circuits and NMOS transistors are produced with the method.

Other features which are considered as characteristic for the invention are set forth in the appended claims.

Although the invention is illustrated and described herein as embodied in a method for producing contact holes, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
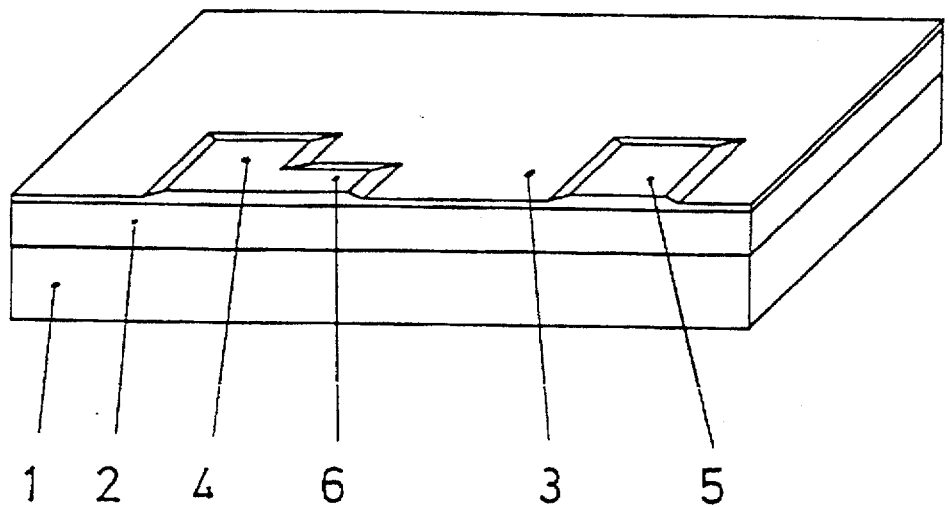
FIG. 1 is a diagrammatic, perspective view showing the status of the method after a first mask technique has been employed.
Figure 2:
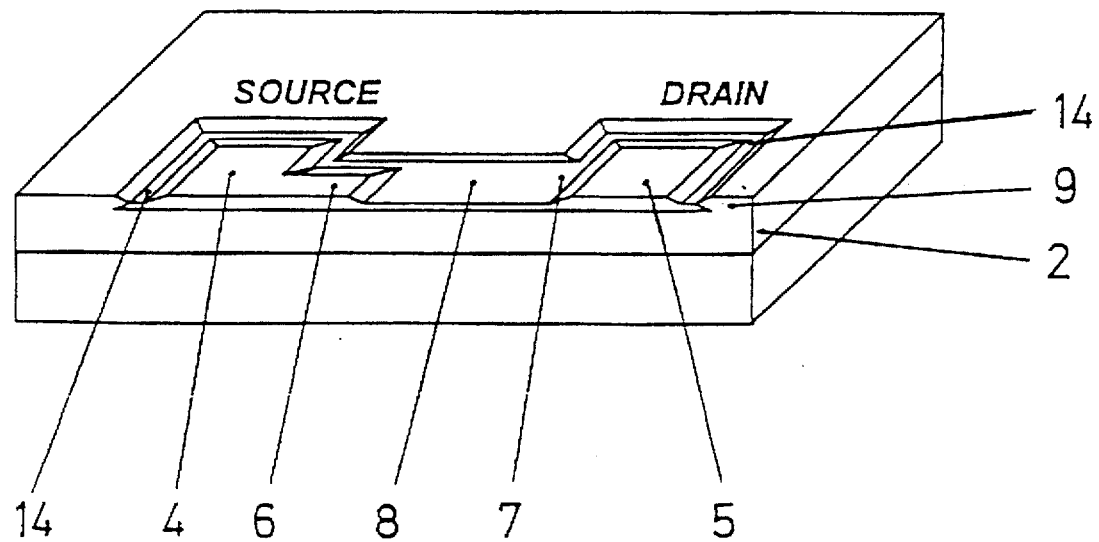
FIG. 2 is a perspective view showing the status of the method after a second mask technique has been employed.

The invention is described in further detail below in terms of an exemplary embodiment shown in the drawing. The diagrammatic illustrations show examples of various stages in the production process for CMOS transistors with locally thicker silicon in a region of contact holes and regions of transistor supply leads.

Referring now to the figures of the drawings in detail and first, particularly, to FIG. 1 thereof, there is seen a basic SOI material, which substantially includes a substrate 1, a buried oxide layer 2, and a silicon layer 3, the latter also being known as a body. The thickness of the silicon layer 1 is approximately 170 nm. Thus the silicon layer is thick enough to ensure that after thinnings dictated by the process, places laid bare in the etching of the contact holes have an adequate thickness for overetching and contact hole post-treatment. In a first local oxidation mask, which may include a nitride or oxynitride, contact hole regions 4, 5 for respective source and drain terminals as well as a supply lead region 6, which in the exemplary embodiment is constructed only as a source supply lead, are covered. Regions which are not covered are oxidized far enough to ensure that the remaining thickness of the silicon layer 1 is thin enough to meet the demands made of "fully depleted" or in other words charge-carrier-free MOS devices. The silicon layer located outside the covered regions is initially oxidized, and then the oxide is removed, so that the thin silicon layer shown in FIG. 1, located outside the covered regions, is the result. This method step is attained by local oxidation of the silicon, or in other words a kind of LOCOS technique.

Subsequently, a second mask is applied, with which the contact hole regions 4, 5, an active region 8, the supply lead region 6 and a supply lead region 7 are covered. This mask is enlarged as compared with the first mask, so that a derivative lead 14 forms around the raised contact hole regions 4, 5, which even further increases the reliability of the process. Outside the oxidation mask, which once again includes nitride or oxynitride, oxidation is carried out with the LOCOS technique. It should be emphasized that the LOCOS technique is carried out entirely in a region which has been thinned in the first method step, and thus the oxidation must be adapted to the thickness of the previously thinned silicon layer. Since there are no varying thicknesses in the region that has been processed, pronounced lateral oxidation underneath other layers is precluded. The LOCOS oxidation creates a raised LOCOS insulation layer 9, located outside the contact hole regions 4, 5, the supply lead regions 6, 7 of the active region 8 and the derivative leads 14.

Figure 3:
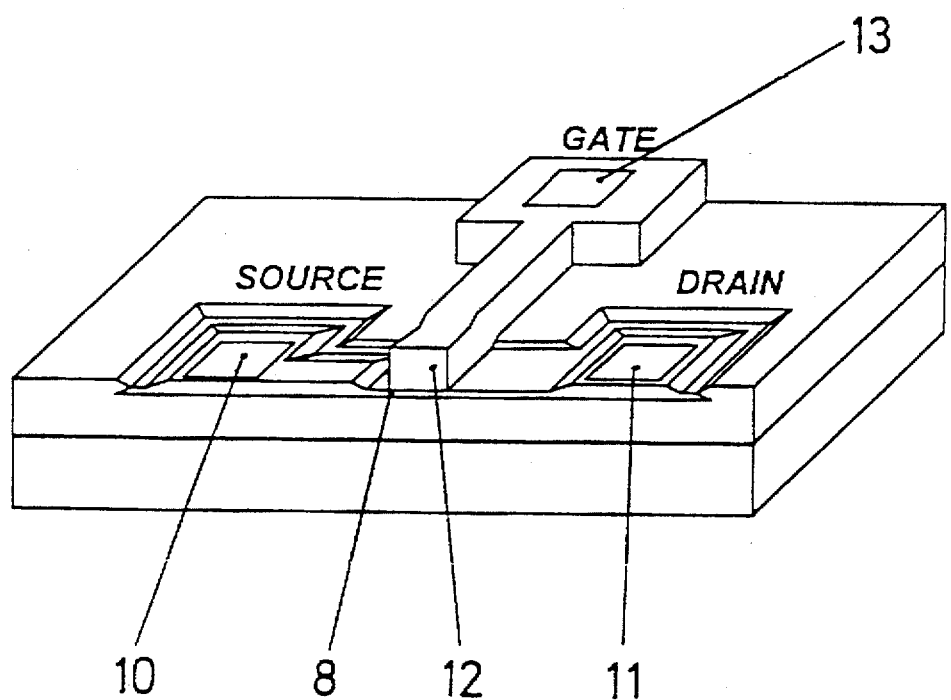
FIG. 3 is a perspective view showing the status in a final stage of the method.

FIG. 3 shows the status of the method after a few further steps. A gate terminal 12 is created, having a silicon supply lead that is carried to the active region 8, which as a result of the preceding process steps is so thin that the silicon is depleted as fully as possible. The contact hole etching operations are performed through an insulating layer which is not shown in FIG. 3 but is also applied over the structure shown. In this figure, a source contact hole 10, a drain contact hole 11 and a gate contact hole 13 are shown. In the contact hole etching, a part of the contact hole regions 4, 5 is removed, but the silicon layer in that region is not removed entirely, since these regions are locally thicker because of the method described herein, and this increases the reliability of the process. The supply lead region 6 from the source contact hole region 4 to the active region 8 is likewise constructed in thickened fashion, so as to reduce the supply lead resistance. The supply lead region 7 from the drain contact hole region 5 to the active region 8 could be constructed in the same way as well.

I claim:

1. A method for producing contact holes in MOS integrated circuits by the SOI technique, which comprises:

covering an oxide layer with a silicon layer having a thickness being greater than a thickness required for active regions of MOS circuits;

applying a first mask to contact hole regions, and thinning regions not covered by the first mask to a thickness suitable for the active regions;

covering the active regions, supply lead regions and the contact hole regions with a second mask, and insulating regions not covered by the second mask with a LOCOS insulation; and then creating connections to the active region and an insulating layer, and effecting contact hole etching through the connections.

2. The method according to claim 1, which comprises covering the supply lead regions with the first mask.

3. The method according to claim 1, which comprises covering a source supply lead region with the first mask.

4. The method according to claim 1, which comprises employing a LOCOS technique following the application of the first mask.

5. The method according to claim 1, which comprises forming the second mask to be larger than the first mask, and forming derivative leads around the contact hole regions.

6. The method according to claim 1, which comprises producing CMOS circuits.

7. The method according to claim 1, which comprises producing NMOS transistors.

* * * * *